(12) United States Patent
Berger (10) Patent No.: US 10,720,775 B2
(45) Date of Patent: Jul. 21, 2020

(54) CONVERTER MODULE FOR CONVERTING ELECTRICAL POWER AND INVERTER FOR A PHOTOVOLTAIC SYSTEM HAVING AT LEAST TWO CONVERTER MODULES

(71) Applicant: SMA Solar Technology AG, Niestetal (DE)

(72) Inventor: Niels Berger, Niestetal (DE)

(73) Assignee: SMA Solar Technology AG, Niestetal (DE)

( * ) Notice: Subject to any disclaimer, the term of this patent is extended or adjusted under 35 U.S.C. 154(b) by 156 days.

(21) Appl. No.: 15/336,021

(22) Filed: Oct. 27, 2016

(65) Prior Publication Data

US 2017/0047739 A1 Feb. 16, 2017

Related U.S. Application Data

(63) Continuation of application No. PCT/EP2015/056469, filed on Mar. 25, 2015.

(30) Foreign Application Priority Data

Apr. 29, 2014 (DE) .................... 10 2014 105 985

(51) Int. Cl.
*H02J 3/38* (2006.01)
*H02J 1/10* (2006.01)
(Continued)

(52) U.S. Cl.
CPC .............. *H02J 3/383* (2013.01); *H02J 1/102* (2013.01); *H02M 3/04* (2013.01); *H02M 7/44* (2013.01); *H05K 5/0256* (2013.01)

(58) Field of Classification Search
CPC .. H02J 1/102; H02J 3/383; H02J 3/14; H02M 3/04; H02M 7/44; H05K 5/0256;
(Continued)

(56) References Cited

U.S. PATENT DOCUMENTS 4,649,491 A * 3/1987 Manduley ............ G01G 19/005
439/212
5,936,833 A 8/1999 Grossman et al.
(Continued)

FOREIGN PATENT DOCUMENTS

DE 29719266 U1 10/1997
DE 102006011241 A1 9/2007
(Continued)

OTHER PUBLICATIONS

International Search Report dated May 13, 2015 PCT/EP/2015/056469.

*Primary Examiner* — Thienvu V Tran
*Assistant Examiner* — Brian K Baxter
(74) *Attorney, Agent, or Firm* — Eschweiler & Potashnik, LLC (57) ABSTRACT

A converter module for converting electrical power by means of a converter circuit having at least one power electronic semiconductor switch driven in a clocked manner is disclosed. The converter module includes a housing, a first DC link circuit terminal, and a capacitance arranged in the housing and connected to the first DC link circuit terminal and to the converter circuit and serving for stabilizing a DC voltage present at the first DC link circuit terminal. The converter module includes a second DC link circuit terminal, which is connected to the capacitance and to the first DC link circuit terminal, wherein the first and second DC link circuit terminals are designed for connection to DC link circuit terminals of further converter modules for converting electrical power. An inverter can be formed by at least two converter modules which are connected to one another via a respective one of their DC link circuit terminals.

13 Claims, 4 Drawing Sheets

(51) Int. Cl.
*H02M 3/04* (2006.01)
*H02M 7/44* (2006.01)
*H05K 5/02* (2006.01)

(58) Field of Classification Search
CPC ..... Y02B 70/3225; Y04S 20/222; G06F 1/26; H01R 25/003
USPC .......................................................... 307/38
See application file for complete search history.

(56) References Cited

U.S. PATENT DOCUMENTS

| | | | |
|---|---|---|---|
| 7,339,287 B2 | 3/2008 | Jepsen et al. | |
| 7,387,537 B1* | 6/2008 | Daily | H01R 13/6272 439/281 |
| 8,363,387 B2 | 1/2013 | Vanhyfte et al. | |
| 2005/0061360 A1* | 3/2005 | Horioka | H02S 40/34 136/244 |
| 2008/0283111 A1* | 11/2008 | Higashikozono | H01L 31/02008 136/244 |
| 2010/0043781 A1 | 2/2010 | Jones et al. | |
| 2010/0275976 A1* | 11/2010 | Rubin | H01L 31/02008 136/251 |
| 2011/0094170 A1* | 4/2011 | Kalkanoglu | H01L 31/02008 52/173.3 |
| 2011/0241433 A1* | 10/2011 | Sihler | H02J 3/383 307/82 |
| 2011/0285352 A1* | 11/2011 | Lim | H02J 7/0019 320/118 |
| 2011/0299265 A1 | 12/2011 | Nakatsu et al. | |
| 2012/0081934 A1 | 4/2012 | Garrity et al. | |
| 2012/0161523 A1* | 6/2012 | Kim | H02J 13/0075 307/66 |
| 2012/0161526 A1* | 6/2012 | Huang | G05F 1/67 307/77 |
| 2012/0319489 A1* | 12/2012 | McCaslin | H02J 1/10 307/77 |
| 2013/0038130 A1* | 2/2013 | Lai | H02M 7/487 307/80 |
| 2013/0063119 A1* | 3/2013 | Lubomirsky | H02J 3/383 323/304 |
| 2013/0090203 A1 | 4/2013 | Hehenberger | |
| 2013/0229844 A1* | 9/2013 | Gazit | H02M 3/158 363/123 |
| 2013/0328403 A1* | 12/2013 | Kaufman | H02J 3/385 307/77 |
| 2014/0103855 A1 | 4/2014 | Wolter | |
| 2014/0176024 A1* | 6/2014 | Butzmann | H02J 7/0013 318/139 |
| 2014/0192570 A1* | 7/2014 | Nielsen | H02J 1/102 363/50 |
| 2017/0085213 A1* | 3/2017 | Petrin | H02S 40/36 |

FOREIGN PATENT DOCUMENTS

DE 102008064565 A1 7/2010
JP 2005117728 A 4/2005

* cited by examiner

CONVERTER MODULE FOR CONVERTING ELECTRICAL POWER AND INVERTER FOR A PHOTOVOLTAIC SYSTEM HAVING AT LEAST TWO CONVERTER MODULES

CROSS REFERENCE TO RELATED APPLICATIONS

This application claims priority to International Patent Application number PCT/EP2015/056469, filed on Mar. 25, 2015, which claims priority to German Patent Application number 10 2014 105 985.9, filed on Apr. 29, 2014, 2014, and is hereby incorporated by reference in its entirety.

FIELD

The disclosure relates to a converter module for converting electrical power and an inverter for a photovoltaic system having at least two converter modules.

BACKGROUND

EP 1195877 A1 discloses a power converter system comprising power converter modules connected via a DC link circuit, wherein the DC link circuit comprises two DC voltage busbars and a DC link circuit capacitance arranged between the DC voltage busbars. In this case, each of the power converter modules is assigned a portion of the DC link circuit capacitance, such that each power converter module is assigned an appropriate proportion of the required DC link circuit capacitance ("distributed DC link circuit"), wherein the proportion is at least high enough that it can carry the AC current introduced into the DC link circuit by the module. As a result, a defective power converter module can be decoupled from the common DC link circuit, such that uninterrupted further operation of the other modules at the DC link circuit is possible.

DE 10062075 A1 discloses a converter comprising integrated DC link circuit capacitors, in which conventional DC link circuit capacitors are shared among a plurality of DC link circuit capacitors of relatively small capacitance which may in each case be an integrated part of a half-bridge or bridge module. A converter may consist of a plurality of such half-bridge or full-bridge modules, wherein the capacitances assigned to the individual modules are defined individually on the basis of the electrical properties of the respective modules and a converter comprises at least one module.

WO 2012/162570 A1 discloses a modular system comprising generators and loads coupled to a common DC voltage bus, wherein generators or loads can be removed from the system or added to the system without further changes to the system. In this case, the voltage at the DC voltage bus may fluctuate between a minimum and a maximum operating voltage depending on a present generated power and a presently consumed power, wherein the generated power or the consumed power is controlled depending on the present voltage at the DC voltage bus.

US 2004/125618 discloses a device for converting electrical power which comprises a regulated DC link circuit, to which different sources can be connected in a flexible manner, e.g., DC-DC converters for a photovoltaic generator or for a battery, and sinks, in particular an inverter bridge for feeding electrical power into an AC voltage grid. The DC link circuit may be embodied as part of an inverter of a photovoltaic system or else as part of one of the further DC-DC converters, for example of a battery charging converter. In this case, the electrical power converted by the device must be regulated in such a way that a voltage of the DC link circuit remains within predefined limits.

DE 102006011241 A1 discloses a series of converter devices comprising a multiplicity of converter devices, wherein each converter device has grid and load terminals. A converter device comprises at least one basic converter device, wherein the basic converter devices are electrically connectable in parallel by means of their grid and load terminals, such that converter devices of different power classes are obtainable by the parallel connection of a plurality of basic converter devices using uniform components.

SUMMARY

The disclosure comprises a converter module for converting electrical power which is simply and flexibly usable for different applications and combinable with converter modules of identical type, and provides an inverter for a photovoltaic system, which inverter comprises at least two converter modules and is simply configurable and extendable.

A converter module according to the disclosure for converting electrical power by means of a converter circuit comprising at least one power electronic semiconductor switch actuated in a clocked manner comprises a housing, a first DC link circuit terminal, and a capacitance arranged in the housing and connected to the first DC link circuit terminal and to the converter circuit and serving for stabilizing a DC voltage present at the first DC link circuit terminal. The converter module also comprises a second DC link circuit terminal, which is connected to the capacitance and to the first DC link circuit terminal. In this case, the first and second DC link circuit terminals are designed for connection to DC link circuit terminals of further converter modules for converting electrical power.

Via the two DC link circuit terminals, the converter module can be simply connected to further converter modules of identical type and be used flexibly. Particularly by virtue of the fact that a second DC link circuit terminal is present alongside the first DC link circuit terminal, a basically arbitrary number of converter modules according to the disclosure can be connected to one another in the form of a chain. Moreover, the capacitance of the converter module according to the disclosure can be connected to the capacitance of further converter modules and form an overall DC link circuit, such that the capacitance of the converter module can be designed to be lower than is actually necessary for the conversion of the rated electrical power by the individual converter module.

The first and second DC link circuit terminals may be arranged oppositely on the housing of the converter module and be embodied in particular as mutually compatible connectors, wherein the connectors may be realized in particular as mating connectors comprising a plug and a socket compatible with the plug. This makes it possible to arrange a plurality of converter modules according to the disclosure spatially in the form of a chain alongside one another or one behind another, wherein the electrical connection between the converter modules is established using simple means, i.e. via a rectilinear conductive connection, e.g. by means of a flexible cable, or by directly plugging together the mutually compatible mating connectors. Moreover, the establishing of the electrical connection may be accompanied by a mechanical connection of the converter modules by virtue of the housings of the converter modules being connected to one another via suitable mechanically compatible locking arrangements, wherein the mechanical connection simultaneously leads to combination of the mating connectors and thus establishing of the electrical connection.

Such plugging together is particularly advantageously made possible by the compatible connectors being arranged on opposite sides of the housing of the converter module. In this case, the connectors are in particular arranged opposite one another in a mirror-inverted manner on the opposite sides of the housing, wherein the mirror axis lies centrally between sides of the housing that are parallel to one another. Consequently, the DC link circuit terminals may be arranged in such a way that they are arranged along a horizontal or a vertical connecting line when the converter modules are in a permissible mounting position, such that an arrangement of converter modules in alignment alongside one another or one above another is made possible.

While individual converter modules can thus be plugged directly onto one another in the case of the DC link circuit terminals embodied as mating connectors, use may also be made of adapters particularly in the case of the compatible connectors. In this case, the adapters may be rigid or partly flexible conductors, for example, which have connectors compatible with the DC link circuit terminals on both sides, such that mating plug connections are respectively producible between them and the DC link circuit terminals.

In this context, the term plug connection also encompasses other types of connection of electrical contacts to one another, in particular screw, clamping or snap-action connections; soldering or welding connections are also conceivable, although the latter slightly reduce the flexibility of the converter module in accordance with the disclosure in comparison with the other types of connection mentioned.

The converter module may have at least one power terminal suitable for transferring electrical power into the converter module and/or out of the converter module. In particular, such a power terminal is provided for connection to a unit that generates and/or consumes electrical power. A unit that generates electrical power is, in particular, a DC generator. A unit that consumes electrical power may comprise, in particular, a DC load, for example a DC circuit having a DC motor or a heating element, or an AC load, for example an AC motor, an island or domestic grid or a public AC voltage grid. In this context, a storage element such as e.g. a battery or a capacitor having high capacitance constitutes a unit that both generates and consumes electrical power bidirectionally. Electrical power may likewise be exchanged bidirectionally with an AC voltage grid.

An inverter according to the disclosure for an energy generating system comprises at least two converter modules for converting electrical power. The converter modules in each case comprise a housing, at least one power terminal and a first DC link circuit terminal. Furthermore, the converter modules comprise a capacitance connected to the first DC link circuit terminal and serving for stabilizing a DC voltage present at the first DC link circuit terminal, and comprise a converter circuit comprising at least one power electronic semiconductor switch actuated in a clocked manner. In this case, the converter circuit of one of the at least two converter modules is embodied as a DC-DC converter and the converter circuit of another of the at least two converter modules is embodied as an inverter bridge. In one embodiment of the inverter the at least two converter modules in each case have a second DC link circuit terminal, which is connected to the capacitance and to the first DC link circuit terminal of the respective converter module, and the at least two converter modules are connected to one another via a respective one of their DC link circuit terminals, such that the capacitances connected via the DC link circuit terminals form a common DC link circuit.

An inverter constructed in this way in its minimal configuration comprising only two converter modules is already suitable for converting an electrical power present at the power terminal of the converter module comprising the DC-DC converter to a different voltage level, for transmitting the electrical power via the connection of the DC link circuit terminals of the converter modules to the converter module comprising the inverter bridge, and then outputting it as AC current via the power terminal of the converter module. In this case, in particular, the capacitances assigned to the two converter modules complement one another to form a total DC link circuit capacitance.

Moreover, the inverter may be flexibly extended by connecting the DC link circuit terminals that remained free in the minimal configuration to the DC link circuit terminals of a further converter. Further converter modules connected in this way—depending on what converter circuit they have—may in turn output and/or take up electrical power via their DC link circuit terminals, which electrical power in turn, on account of the connection of the DC link circuit terminals, is available to and/or is made available by all the converter modules for further processing. As a result of such an extension, in addition, the total DC link circuit capacitance of the inverter increases by the capacitances assigned to the added converter modules.

In particular, the capacitances connected to the DC link circuit terminals of the at least two converter modules may be designed in such a way that the variation of the voltage present at the DC link circuit terminals is limited to an amount that is acceptable for the operation of the inverter. By way of example, the variation, i.e. the fluctuation range of the voltage of the total DC link circuit of the inverter, may be limited to a predefined maximum variation, wherein the maximum variation occurs in particular during operation of the inverter with a maximum electrical power. Moreover, the total DC link circuit voltage is not permitted to fall below a minimum voltage necessary for feeding an AC current into an AC voltage grid as a lower limit if the power terminal of the converter module comprising the inverter bridge is connected to such an AC voltage grid and is intended to feed electrical power therein. A variation limited in this way is ensured by an inverter according to one embodiment of the disclosure only if the capacitance of one of the at least two converter modules is connected via at least one of the DC link circuit terminals to at least one capacitance of another of the at least two converter modules and a total DC link circuit capacitance that is increased in comparison with the individual capacitances of the at least two converter modules is thus effective, which sufficiently stabilizes the total DC link circuit voltage. In this case, the maximum electrical power flows from one or a plurality of the power terminals of the at least two converter modules via the DC link circuit terminals to one or a plurality of other power terminals.

The maximum electrical power is a property of the inverter as a whole and is not necessarily identical to a maximum power of an individual converter module, wherein the latter is predefined in particular by the properties of the semiconductor switches of the converter circuits assigned to the individual converter modules. In particular, the maximum power of the inverter can be increased by connecting a plurality of converter modules which have converter circuits of identical type to one another via the DC link circuit terminals. By virtue of the fact that the total DC link circuit capacitance also increases as a result of such a connection of the DC link circuit terminals, the maximum allowed variation of the total DC link circuit voltage is readily complied with and not exceeded even after the increase in the maximum power of the inverter.

In one embodiment, the first DC link circuit terminal of one of the at least two converter modules is connected to the second DC link circuit terminal of another of the at least two converter modules. In particular, the DC link circuit terminals of each of the at least two converter modules may be arranged oppositely on its housing. What can be achieved as a result is that the converter modules may be arranged in a series alongside one another or one above another, wherein the respective outer converter modules among the converter modules of such a series in each case have a still free DC link circuit terminal, which may be connected to the DC link circuit terminals of further converter modules for the purpose of flexibly extending the inverter.

In a further embodiment, the at least two converter modules have an identical shaping and are mounted with direct connection, i.e. in particular a horizontal or vertical connection, of a respective one of their corresponding DC link circuit terminals. In this case, the first and second DC link circuit terminals of each of the at least two converter modules are arranged with respect to one another in such a way that the at least two converter modules are oriented in alignment with one another with a housing side along a horizontal or vertical orientation line.

In one embodiment the direct connection may be realized via DC link circuit terminals embodied as mutually compatible connectors, wherein the connectors may be embodied in particular as mating connectors comprising a plug and a socket compatible with the plug. In this case, the connection may be produced by the DC link circuit terminals being plugged directly onto one another, such that the converter modules are positioned directly adjacently. Alternatively, the connection may be produced via adapters, for example rigid or partly flexible conductors, or else by means of flexible cables with suitable end pieces. In this context, the term plug connection also encompasses other types of connection of electrical contacts to one another, in particular screw, clamping or snap-action connections; soldering or welding connections are also conceivable, although the latter slightly reduce the flexibility of the converter module in accordance with the disclosure in comparison with the other types of connection mentioned.

In a further embodiment, the converter modules of an inverter comprise control devices for actuating the semiconductor switches of the respective converter module and communication means for producing a communication connection between the individual converter modules. In this case, the communication means may be embodied as wireless interfaces or else in particular as communication terminals for line-based communication, wherein an optical waveguide connection should also be regarded as line-based and the communication terminals of the converter modules are connected to one another. The connection of the communication terminals, as in association with the connection of the DC link circuit terminals embodied as mating connectors, can be established simultaneously with the establishing of a mechanical connection of the housings of adjacent converter modules by virtue of the fact that the communication terminals can be embodied as compatible mating connectors.

The control devices may be connected to the communication means and configured to communicate with one another via the communication means and the communication connection as established between the communication means of a plurality of converter modules. As a result, operating parameters of the individual converter modules can be coordinated with one another, wherein the operating parameters and thus the operation of the inverter depend overall in particular on the respective properties of the individual converter modules. Such coordination, in the case of a change in the number or type of the converter modules, in particular in the case of an extension of the inverter with additional converter modules, can be coordinated with the operating conditions that are altered as a result.

Moreover, it is conceivable to set up the communication between the converter modules as a master-slave system, wherein the control unit assigned to one of the converter modules performs the function of a master and can in particular also control the operation of the inverter overall, wherein all the control units assigned to the further converter modules are operated as slaves with operating parameters predefined by the master.

The inverter according to the disclosure comprises at least two converter modules, of which at least one comprises a DC-DC converter and at least another comprises an inverter bridge. In one embodiment of this inverter, at least one power terminal of the converter module having the DC-DC converter may be designed for connecting a DC generator, a DC battery or a DC load. Furthermore, a power terminal of the converter module having the inverter bridge may be designed for connecting an AC voltage grid or an AC load. In particular, the inverter may have exactly two converter modules in a minimal configuration—a first converter module comprising a DC-DC converter and a second converter module comprising an inverter bridge—wherein a photovoltaic generator is connectable to a power terminal of the first converter module and an AC voltage grid is connectable to a power terminal of the second converter module. In such a configuration, an inverter according to the disclosure is usable particularly advantageously in an energy generating system, in particular in a grid-coupled photovoltaic system. In this case, on account of the modular construction of the inverter and the properties of the converter modules, in particular on account of the properties of the DC link circuit capacitances and the configuration of the DC link circuit terminals of the converter modules, the inverter is flexibly extendable by addition of further converter modules and/or by exchange of existing converter modules. The inverter can be extended both with regard to increasing the maximum electrical power that can be converted, and with regard to adding functionalities of the energy generating system. In this regard, for example, an energy store, e.g. a battery, can be added or else an autonomous AC terminal fed by the PV generator and/or by a battery and serving for emergency power supply or the like can be made available.

Further applications for converter modules according to the disclosure and inverters according to the disclosure shall be mentioned below by way of example, without any claim to completeness.

By means of a converter module a—bidirectional where appropriate—transmission of electrical power from a power terminal of the converter module to the DC link circuit capacitance of the converter module can be effected, wherein a battery, a fuel cell, a wind or water power generator, a diesel unit, a public AC voltage grid, an AC voltage island grid having generators and/or loads, and/or an individual AC load can be connected to the power terminal—depending on the configuration of the converter circuit of the converter module.

A converter module can be classified into a power class on the basis of the electrical power that it can convert, wherein the converter modules of an inverter may have different power classes. Different converter modules may have different voltage levels, i.e. different translation ratios between permissible voltages at a power terminal of a converter module and the voltage at the DC link circuit terminals thereof.

Power terminals of converter modules which have an inverter bridge may be embodied in a single-phase fashion or in a polyphase fashion, in particular in a three-phase fashion and with or without connection for a neutral conductor.

Power terminals of converter modules which have a DC-DC converter may be embodied singly or multiply, such that one generator or a plurality of generators can be connected, wherein, in the case of a plurality of generators that can be connected, the electrical power levels of the generators can be combined in parallel and be processed by one converter circuit or individually by a plurality of converter circuits connected in parallel on the link circuit side. Analogous configurations are conceivable for converter modules whose power terminals are configured for connecting energy stores such as batteries. In this case, the converter modules can be configured in particular on the basis of specifically adapted, i.e. in particular specifically programmed, control devices for the bidirectional exchange of electrical power with batteries of a wide variety of types, for example with lithium-ion batteries, lead-acid batteries or electrochemical batteries (e.g. redox flow cells).

The advantages of the disclosure include the fact that a modular system having a minimum number of interfaces can be realized. In this case, each module comprises "one half" of a desired application from a power terminal to a DC link circuit or starting from the DC link circuit to the power terminal, wherein each module has to provide in particular a DC link circuit comprising (only) half capacity necessary for dealing with the magnitude of the electrical power that can be converted by the respective module. It is thus possible to realize complete applications, in particular inversion but also other forms of conversion of the electrical power, by flexible combination of a small number of individual components, wherein different energy sources (PV, wind, fuel cell, battery, AC grid, etc.) are virtually arbitrarily combinable with different energy sinks (fuel cell, battery, AC grid, AC island load, etc.). The common power interface is the total DC link circuit that can be contacted via the DC link circuit terminals, and exchange of a module is possible without other modules having to be demounted for this purpose.

Overall, the solution according to the disclosure is more practicable, more efficient and also more cost-effective, in particular as soon as a certain application-side flexibility is desired, and since components of the modules, in particular the DC link circuit capacitances, have to be kept available only once, but can be used in many applications.

A converter module may comprise specific additional functions—depending on embodiment and, in concrete terms, components connectable to its power terminal, i.e. sources and/or sinks of electrical power. A converter module comprising an inverter bridge may provide a device for grid monitoring and/or for grid isolation. Moreover, a converter module comprising a DC-DC converter may for example provide an arc identification for and/or a power line communication via DC lines connectable to its power terminal, wherein the DC lines connect the converter module in turn for example to a photovoltaic generator and/or to a possibly interposed power line transceiver, which may be arranged in particular in a generator terminal box.

Furthermore, a converter module may comprise a device for adapting the DC voltage present at the power terminal of the converter module, the device being configured to set the DC voltage to a value at which a photovoltaic generator connected to the power terminal of the converter module outputs its maximum electrical power (so-called maximum power point tracking, for short: MPP tracking).

Furthermore, converter modules may comprise a wide variety of types of sensors, in particular ones for detecting electrical operating parameters such as currents and voltages and for detecting other operating parameters such as e.g. temperatures. These operating parameters may be processed by the control device of the respective converter module and/or be communicated to further converter modules via the communication means, wherein the control devices operate the converter circuit of the respective converter module if appropriate depending on operating parameters of the respective converter module and/or of the further converter modules.

Alongside the control devices assigned to the converter modules, a superordinate control device may be provided, which may perform relevant functions for operation of an apparatus comprising a plurality of converter modules, as an alternative or in addition to the control devices assigned to the converter modules. In this regard, in particular in an inverter according to the disclosure, such a superordinate control device may be configured for example for safeguarding the inverter against malfunctions or grid faults (e.g. global emergency off or so-called fault ride through), for coordinating the operation of the individual converter modules (e.g. defining whether loads are disconnected, whether batteries are intended to be charged or discharged, etc.) or else for synchronization (harmonization with a common DC link circuit voltage).

The housings of the converter modules may have cooling devices, in particular cooling ribs or heat sinks arranged at the rear side. The cooling devices may be arranged in such a way that, in the case of an inverter comprising a plurality of converter modules, a continuous cooling channel arises which extends continuously horizontally or vertically in the case of converter modules arranged alongside one another or one above another, respectively. A cooling unit, for example a fan, which generates a cooling air flow that cools the entire inverter, may be arranged at one end of such a common cooling channel.

BRIEF DESCRIPTION OF THE DRAWINGS

The disclosure is explained and described further below on the basis of example embodiments illustrated in the figures.

DETAILED DESCRIPTION

Inverters for photovoltaic systems serve for converting an electrical power generated by a photovoltaic generator in the form of an electrical DC current into an AC current for feeding into an AC voltage grid. For this purpose, an inverter regularly comprises an input-side DC-DC converter for setting the DC voltage present at the photovoltaic generator, a DC link circuit and an output-side inverter bridge.

Figure 1:
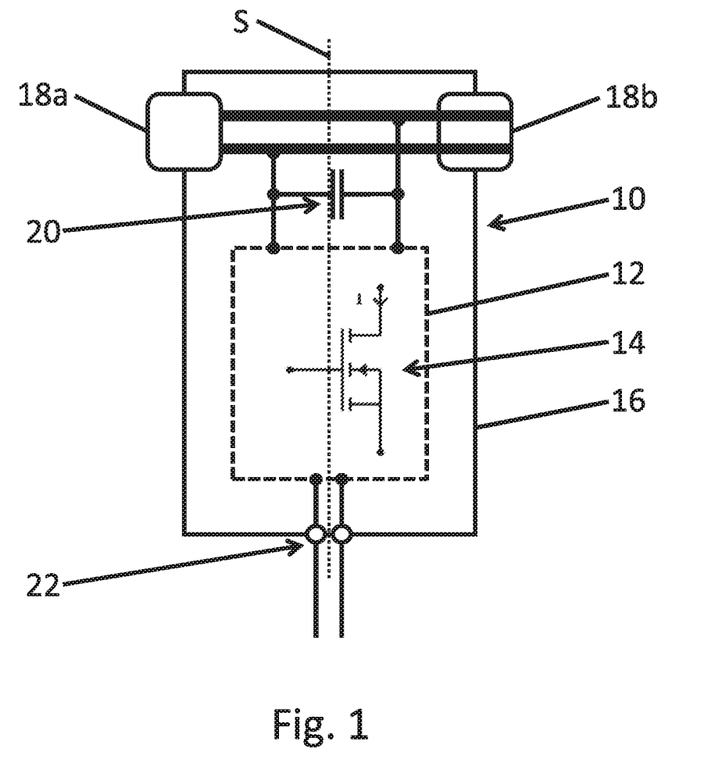
FIG. 1 shows a converter module according to the disclosure.

FIG. 1 shows a converter module 10 comprising a converter circuit 12 comprising a power electronic semiconductor switch 14 and a housing 16. The converter circuit 12 is connected to DC link circuit terminals 18a and 18b. A capacitance 20 is connected to the converter circuit 12 and the DC link circuit terminals 18a, 18b. Furthermore, the converter circuit 12 is connected to a power terminal 22. The converter circuit 12 can be embodied as a DC-DC converter or as an inverter bridge and unidirectionally or bidirectionally transfer electrical power between the power terminal 22 and the capacitance 20 or the DC link circuit terminals 18a, 18b.

In the case of an embodiment as DC-DC converter, the converter circuit 12 may be embodied in concrete terms for example as a boost converter, as a buck converter or as a boost-buck converter and comprise one or a plurality of semiconductor switches 14 and, if appropriate, further electrical or electronic components such as diodes, inductors or capacitors. The converter circuit 12 may comprise a plurality of DC-DC converters connected in series or in parallel, wherein, especially in the case of a plurality of DC-DC converters connected in parallel on the DC link circuit side, each DC-DC converter may be respectively assigned a dedicated power terminal 22.

In the case of an embodiment as a single-phase or polyphase inverter bridge, the converter circuit 12 may be embodied in concrete terms for example as a half-bridge, as a full-bridge (H4, H5, or H6 bridge) or as an NPC bridge and comprise one or a plurality of semiconductor switches 14 and, if appropriate, further electrical or electronic components such as diodes, inductors or capacitors. In this case, too, the converter circuit 12 may comprise a plurality of inverter bridges connected in series or in parallel, wherein, especially in the case of a plurality of inverter bridges connected in parallel on the DC link circuit side, each inverter bridge may be respectively assigned a dedicated power terminal 22.

The DC link circuit terminals 18a, 18b may be embodied as mutually compatible connectors. In the concrete embodiment in accordance with FIG. 1, the DC link circuit terminal 18a is embodied as a socket and the other DC link circuit terminal 18b as a plug, such that the combination of the DC link circuit terminals 18a, 18b constitutes a mating plug connection and the DC link circuit terminals 18a, 18b are designed in particular for connection to DC link circuit terminals 18b and 18a, respectively of further converter modules 10. This becomes clear from the inverters 30 according to the disclosure as illustrated in the subsequent figures (see FIGS. 2 to 4), which inverters are constructed in each case from a plurality of converter modules 10.

The DC link circuit terminals 18a, 18b may be arranged on opposite sides of the housing 16. In particular, the DC link circuit terminals 18a, 18b may be arranged opposite one another in a mirror-inverted manner wherein a mirror axis S lies centrally between and parallel to sides of the housing 16 that are parallel to one another.

Figure 2:
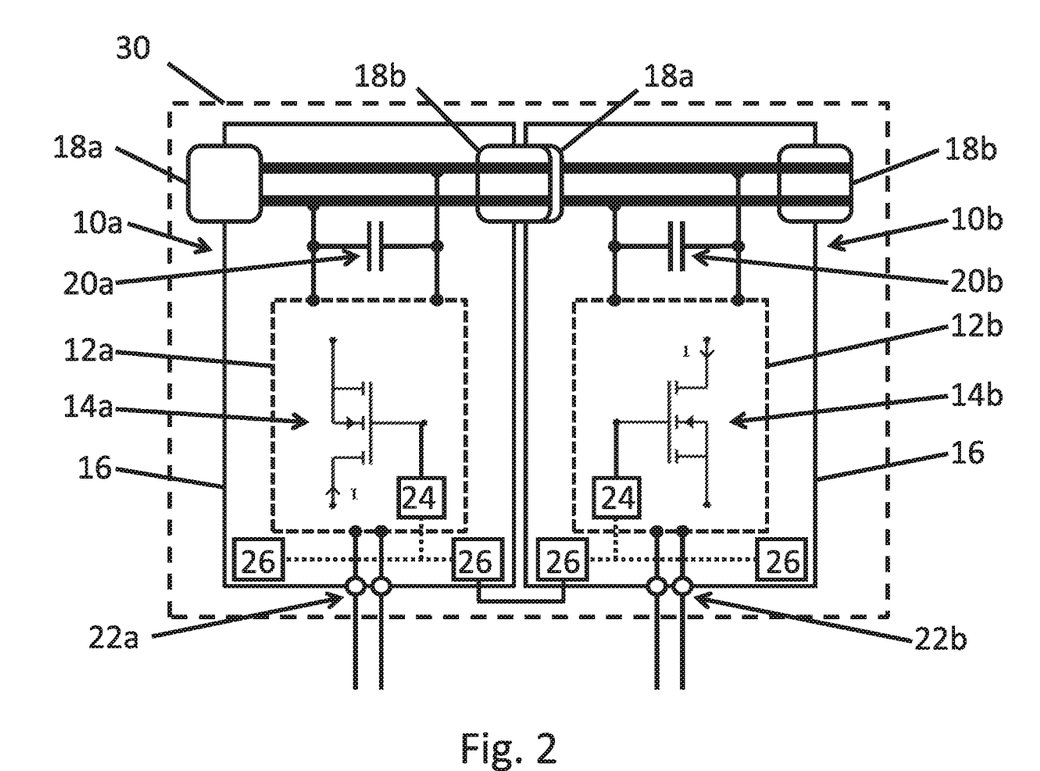
FIG. 2 shows an inverter according to the disclosure in a first embodiment comprising two converter modules.

FIG. 2 shows an inverter 30 according to the disclosure, this inverter comprising two converter modules 10a and 10b. As indicated by the orientation of the semiconductor switches 14a, 14b in the converter circuits 12a, 12b of the converter modules 10a, 10b, the converter modules 10a, 10b fulfill different functions. In concrete terms, the converter circuit 12a of the converter module 10a is constructed as a DC-DC converter and the converter circuit 12b of the converter module 10b is constructed as an inverter bridge. As a result, the inverter 30 is configured to convert an electrical power of a DC generator connectable to the power terminal 22a of the converter module 10a firstly to a different DC voltage level by means of the converter circuit 12a and to feed it into a DC link circuit. The DC link circuit is formed from the capacitances 20a and 20b, which are connected to one another via the DC link circuit terminal 18b of the converter module 10a and the DC link circuit terminal 18a of the converter module 10b. The converter circuit 12b of the converter module 10b, the converter circuit being constructed as an inverter circuit, can draw the electrical power converted in this way from the DC link circuit and convert it into an AC current by means of the semiconductor switch(es). The AC current can be output via the power terminal 22b of the converter module 10b and be fed in particular into an AC voltage grid connectable to the power terminal 22b.

The converter modules 10a, 10b have control devices 24 configured for controlling the converter circuits 12a, 12b and in particular for driving the semiconductor switches 14a, 14b. In addition, the converter modules have communication means, illustrated in concrete terms as communication terminals 26 in FIG. 2. The converter modules 10a, 10b are connected to one another via the communication terminals 26.

The control devices 24 can actuate the semiconductor switches 14a, 14b by means of clocked actuation signals. In this case, the actuation may be implemented in the form of open-loop or closed-loop control, wherein the control devices 24 may use measurement data from current and voltage sensors (not illustrated here) in the context of the open-loop or closed-loop control. Via the communication means connected to the control units 24, in particular via the communication terminals 26, the control devices 24 can exchange among one another, or if appropriate with a superordinate control device (not illustrated), the data relevant to the control of the converter circuits 12a, 12b in the assemblage. The data may comprise measurement data and present actuation parameters and also metadata determined therefrom, such as e.g. the electrical power presently converted by a converter module 10a, 10b. Furthermore, the control device 24 of one of the converter modules 10a, 10b may be configured as a master, such that the control device 24, besides actuating the converter circuit 12a or 12b directly assigned thereto, on the basis of a communication of control signals to the control units 24 of the further converter modules 10a, 10b of the inverter 30, also influences the operation of the further converter modules 10a, 10b. By way of example, in this way it is possible to predefine a setpoint value for a voltage at the DC link circuit terminals 18a, 18b which is intended to be used as a target variable in the context of a closed-loop control by all the control units 24.

Figure 3:
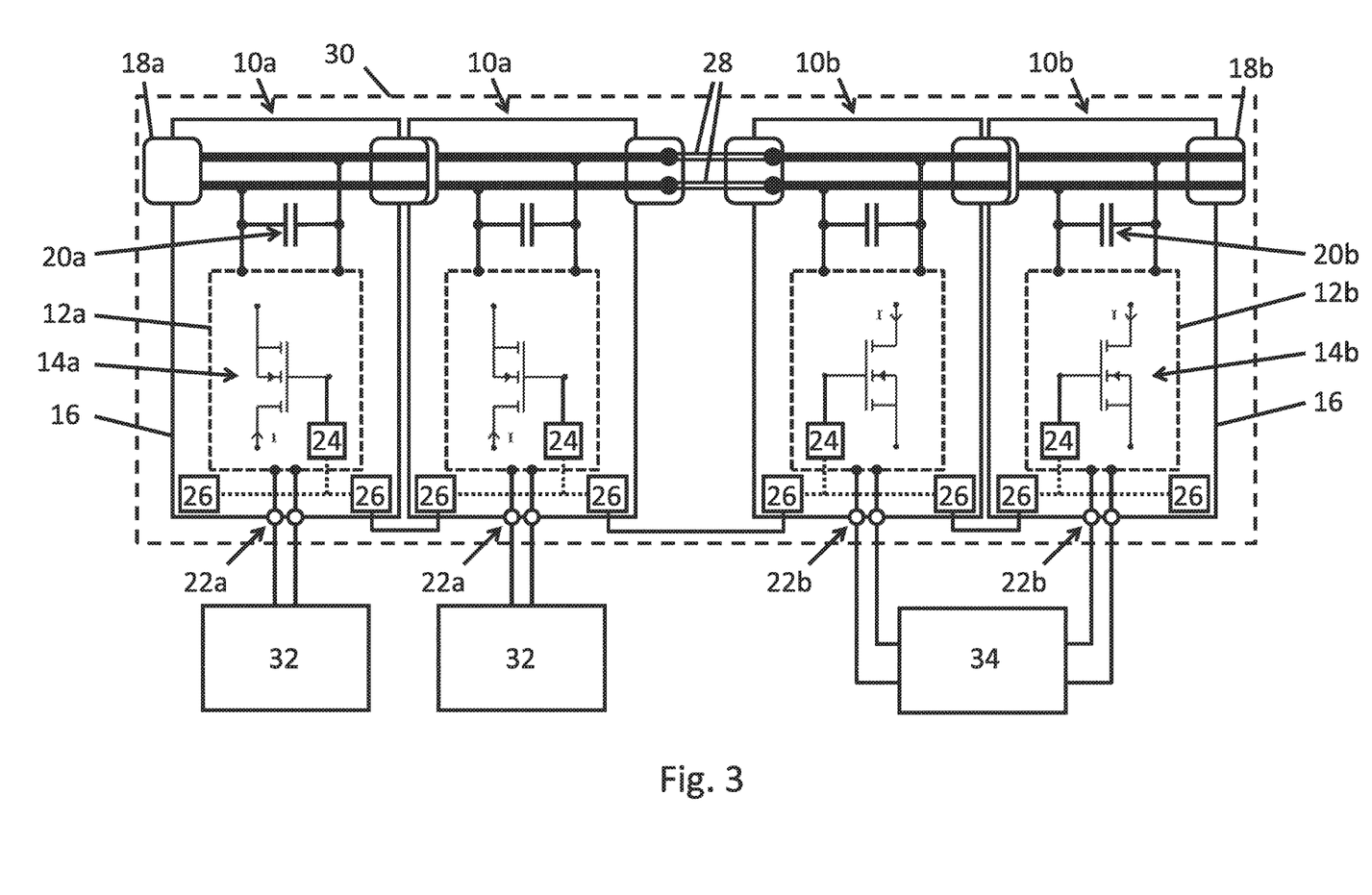
FIG. 3 shows an inverter according to the disclosure in a second embodiment comprising four converter modules, PV generators connected on the input side and an AC voltage grid connected on the output side.

FIG. 3 shows an embodiment of an inverter 30 that differs from the embodiment in accordance with FIG. 2 in that instead of one converter module 10a now two converter modules 10a are provided, which comprise in each case a converter circuit 12a embodied as a DC-DC converter. Furthermore, instead of one converter module 10b now two converter modules 10b are provided, which comprise in each case a converter circuit 12b embodied as an inverter bridge.

As a result, the maximum electrical power of the inverter 30 is doubled in comparison with the embodiment in accordance with FIG. 2. This doubling is realized by virtue of the fact that the additional converter modules 10a, 10b in comparison with the embodiment in accordance with FIG. 2 are connected to the inverter 30 in accordance with FIG. 2 by means of a connection of their DC link circuit terminals 18a and 18b, respectively, to the free DC link circuit terminals 18b and 18a, respectively, of the converter modules 10a and 10b, respectively, of the inverter 30 in accordance with FIG. 2. This connection can be effected directly, such that the housings 16 of the converter modules 10a, 10b are arranged directly adjacently and are oriented in alignment with one another for example with the upper edge of their housings 16 along a horizontal orientation line if the DC link circuit terminals 18a, 18b are embodied as compatible mating connectors and are arranged in a mirror-inverted manner with respect to one another on the opposite sides of the housings 16. Alternatively, the connection can be produced by means of an adapter 28, such that the converter modules can be arranged in a manner spaced apart spatially and, if appropriate, also vertically offset with respect to one another.

The inverter 30 in accordance with FIG. 3 is used in an energy generating system, in particular in a photovoltaic system, by virtue of a respective photovoltaic generator 32 being connected to the power terminals of the two converter modules 10a, wherein the photovoltaic generators 32 may in turn consist of a series and/or parallel connection of individual photovoltaic modules. It is also conceivable to connect a plurality of photovoltaic generators 32 to one of the converter modules 10a or to both converter modules 10a if the converter module(s) 10a has (have) a plurality of power terminals 22a. It goes without saying that the photovoltaic generators 32 can also be connected in parallel, such that the electrical power output by them can be divided between the two converter modules 10a. In this case, the parallel connection can be designed to be interruptible by means of a switch, such that for example in partial load operation, particularly if both photovoltaic generators 32 together generate an electrical power that is less than the rated power of one of the converter modules 10a, the parallel connection is established, such that only one converter module 10a is operated and the other converter module 10a is deactivated. In addition, in this case, the control units 24 can be used to control which of the converter modules 10a is activated, and this assignment can be regularly swapped in order to minimize the operating times of the converter modules 10a. If the two photovoltaic generators 32 together generate an electrical power that is greater than the rated power of one of the converter modules 10a, the parallel connection can be interrupted, such that the photovoltaic generators 32 can be operated independently of one another, wherein the converter modules 10a can set in particular the operating point with maximum electrical power (the so-called maximum power point) for the photovoltaic generators 32 independently of one another.

Optionally, a converter module 10a, 10b can have a disconnection device between converter circuit 12a, 12b and capacitance 20a, 20b or between capacitance 20a, 20b and the DC link circuit terminals 18a, 18b, wherein such a disconnection device can electrically decouple a deactivated converter module 10a, 10b from the common DC link circuit.

The converter modules 10a comprise converter circuits 12a which are embodied as DC-DC converters and which convert the electrical power drawn via the power terminals 22a to a different DC voltage level and feed it into the DC link circuit of the inverter 30. The DC link circuit of the inverter 30 is formed from the capacitance 20a, 20b of all four converter modules 10a, 10b the capacitances being connected via the DC link circuit terminals 18a, 18b.

The converter modules 10b comprise converter circuits 12b which are embodied as inverter bridges and which draw the electrical power from the DC link circuit and convert it into an AC current. The AC current can be fed via the power terminals 22b into an AC voltage grid 34 connected thereto. It goes without saying that instead of the parallel feeding into an AC voltage grid 34 by the converter modules 10b, it is also possible to realize an individual feeding into two separate AC voltage grids 34 or two separate phases of the AC voltage grid 34. Analogously to the explanations regarding the parallel connection of a plurality of converter modules 10a having DC-DC converters, suitable disconnection devices can also be provided between converter modules 10b having inverter bridges, such that one of the converter modules 10b can be deactivated for example in partial load operation.

Figure 4:
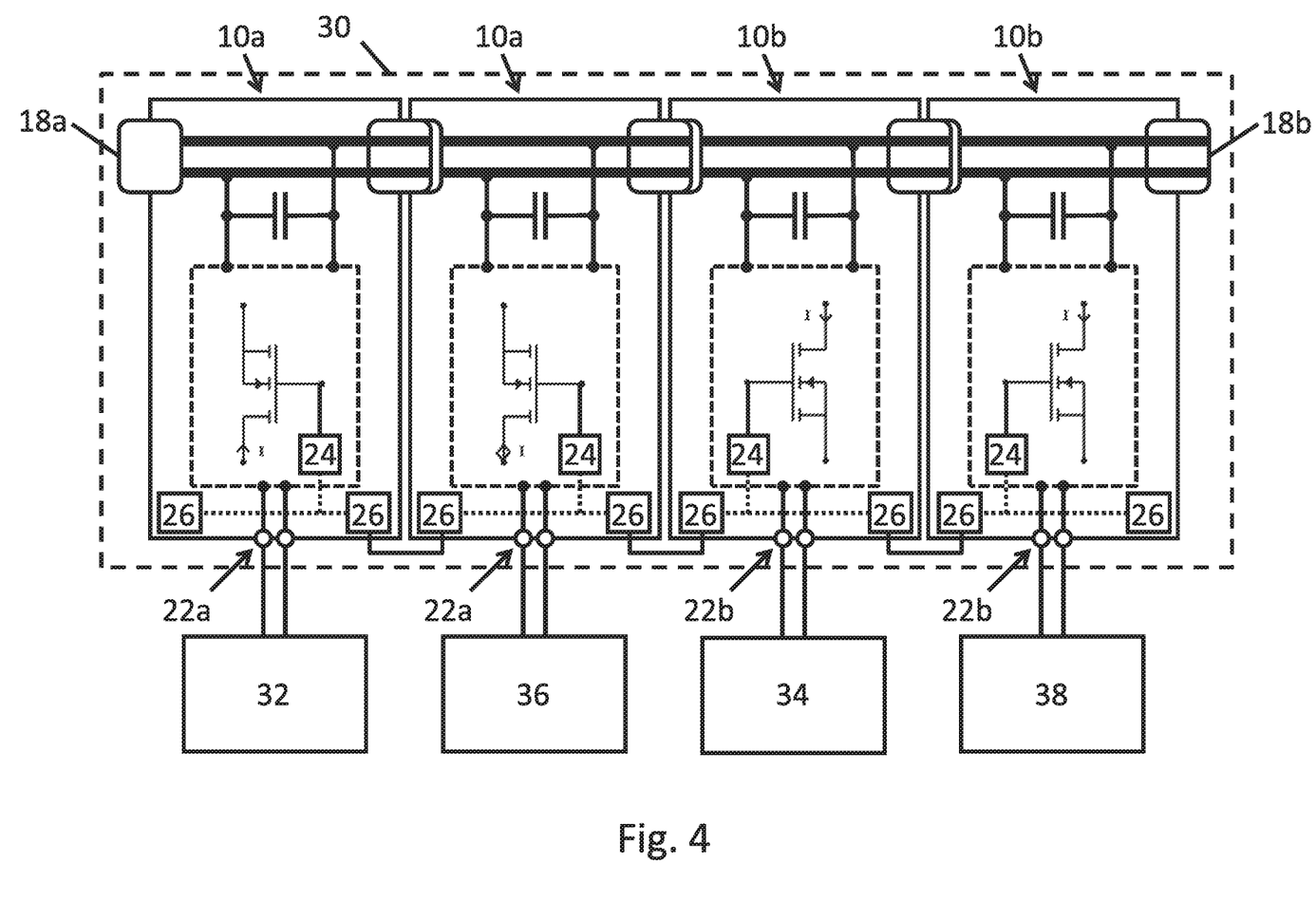
FIG. 4 shows an inverter according to the disclosure in a third embodiment comprising four converter modules, a PV generator connected on the input side, a battery and an AC voltage grid and AC load connected on the output side.

FIG. 4 illustrates a further embodiment of an inverter that differs from the embodiment in accordance with FIG. 2 in that a storage element 36, in particular a rechargeable battery, is connected to one of the converter modules 10a comprising a DC-DC converter, wherein the DC-DC converter of the converter module 10a is embodied in a bidirectional fashion and can charge and discharge the storage element 36. Moreover, now an electrical load, for example a motor or a heating element, or an isolated domestic grid having a plurality of loads is connected to one of the converter modules 10b comprising an inverter bridge. As in FIG. 3, a photovoltaic generator 32 and an AC voltage grid 34 are respectively connected to the respective other converter modules 10a, 10b. In this case, the inverter bridge of the converter module 10b can also be embodied in a bidirectional fashion and exchange electrical power bidirectionally via its power terminal 22b.

Such a configuration of the inverter 30 can also be established in a simple manner from the minimal configuration in accordance with FIG. 2 by virtue of the fact that, as already described in association with FIG. 3, the additional converter modules 10a, 10b are connected to the existing converter modules 10a, 10b via the DC link circuit terminals 18a, 18b.

In the case of the configuration in accordance with FIG. 4, it should additionally be taken into consideration that—depending on the rated electrical power of the individual converter modules 10a, 10b—a power flow can occur which exceeds the rated power of an individual converter module 10a, 10b. Particularly if all four converter modules 10a, 10b are designed for virtually identical rated power, a situation can occur, for example, in which the photovoltaic generator 32 on account of high insolation and thus also the converter module 10a connected thereto operate almost with rated power. If at the same time from the storage element 36, by means of the converter module 10b connected thereto, the full rated power thereof will be drawn, the electrical power introduced into the DC link circuit in this way must be correspondingly carried away by both converter modules 10b. Since this cannot be ensured by an individual one of the converter modules 10b, a division of the electrical power between both converter modules 10b must take place in order to avoid the overloading of the converter modules 10b. This is ensured on the basis of a suitable communication of predefined values for controlling the individual converter modules 10a, 10b via the communication interfaces. In this case, the predefined values can be predefined by one of the control devices 24 according to the master-slave principle already mentioned or by a superordinate control device (not illustrated) of the inverter 30 and be communicated via the communication terminals 26.

The arrangement of the individual converter modules 10a, 10b may be chosen such that the electrical power flowing between the power terminals 22a, 22b has to pass through the fewest possible number of DC link circuit terminals 18a, 18b and the shortest possible line lengths, such that in particular the current loading of the electrical connections between the converter modules 10a, 10b is minimized. In a departure from one of the arrangements in accordance with FIG. 3 or FIG. 4, it may therefore be advantageous, for example, to arrange the converter modules 10a and 10b alternately or else to arrange the converter modules 10a on the outer side and the converter modules 10b on the inner side, or vice-versa. In particular, a converter module 10a comprising a DC-DC converter can be arranged in each case alongside a converter module 10b comprising an inverter bridge. Depending on the number and type of the converter modules 10a, 10b present overall in the inverter 30, other arrangements may however also be optimal for this purpose.

An inverter 30 comprising a number of converter modules 10a, 10b greater than or equal to that of the inverter in accordance with FIG. 3 or FIG. 4 remains ready for operation basically even if one of the converter modules 10a, 10b is removed, for example for servicing purposes. In such a case, by means of suitable adapters 28 it is possible to establish an electrical connection across the gap left by the absent converter module 10a, 10b. In addition, the control devices 24 may be configured for the possibly reduced total power of the inverter 30 by means of suitable programming.

It goes without saying that the arrangements of the converter modules 10a, 10b as illustrated in FIGS. 2 to 4 should be understood to be by way of example in so far as an arrangement rotated by 90 degrees is also conceivable, such that the DC link circuit terminals 18a, 18b are arranged on the top side and underside or else on the front and rear sides of the housings 16. By means of a longer, possibly flexible or angularly shaped adapter 28, it is also possible to produce an arrangement of the converter modules 10a, 10b in a plurality of horizontally, vertically or obliquely extending series.

The housings 16 of the converter modules 10a, 10b may have a largely identical shaping. A use of identical housings for different converter modules 10a, 10b is advantageous here from the point of view of costs, wherein adaptations of the housing 16 to different functions of concrete converter modules 10a, 10b are possible. In particular, the housings 16 may have fixing means internally and externally, onto which the various parts of the converter modules 10a, 10b can be mounted, for example the converter circuits 12a, 12b on the inside and cooling devices or heat sinks on the outside. Overall, different housings 16 for different converter modules 10a, 10b may arise as a result.

Advantageous developments of the disclosure are evident from the patent claims, the description and the drawings. The advantages of features and of combinations of a plurality of features as mentioned in the description are merely by way of example and may take effect alternatively or cumulatively, without the advantages necessarily having to be achieved by embodiments according to the disclosure. Without the subject matter of the accompanying patent claims being altered hereby, the following holds true with regard to the disclosure content of the original application documents and of the patent: further features can be gathered from the drawings—in particular the illustrated geometries and the relative dimensions of a plurality of component parts with respect to one another and the relative arrangement of operative connection thereof. The combination of features of different embodiments of the disclosure or of features of different patent claims is likewise possible departing from the chosen dependency references of the patent claims and is suggested hereby. This also concerns such features which are illustrated in separate drawings or are mentioned in the description thereof. These features may also be combined with features of different patent claims. Likewise, features presented in the patent claims may be omitted for further embodiments of the disclosure.

The features mentioned in the patent claims and in the description should be understood, with regard to their number, such that exactly this number or a greater number than the number mentioned is present, without the need for explicit use of the adverb "at least". Therefore, if an element is mentioned, for example, this should be understood to mean that exactly one element, two elements or more elements are present. These elements may be supplemented by further features or be the sole elements to which the respective method relates.

The reference signs contained in the patent claims do not restrict the scope of the subjects protected by the patent claims. They merely serve the purpose of making the patent claims more easily comprehensible.

The invention claimed is:

1. A converter module for converting electrical power by means of a converter circuit comprising at least one power electronic semiconductor switch actuated in a clocked manner comprising:
   a housing,
   a first DC link circuit terminal comprising a first pair of connectors,
   a capacitance arranged in the housing and connected to the first DC link circuit terminal and to the converter circuit and configured to stabilize a DC voltage present at the first DC link circuit terminal, wherein each connector of the first pair of connectors is coupled to a respective contact of a pair of contacts of the capacitance,
   a second DC link circuit terminal comprising a second pair of connectors, which is connected to the capacitance and to the first DC link circuit terminal, wherein each connector of the second pair of connectors is coupled to the respective contact of the pair of contacts of the capacitance, wherein the first and second DC link circuit terminals are configured to connect to DC link circuit terminals of further converter modules for converting electrical power, and wherein the second DC link circuit terminal is different from the first DC link circuit terminal.

2. The converter module as claimed in claim 1, wherein the first and second DC link circuit terminals are arranged oppositely on the housing of the converter module.

3. The converter module as claimed in claim 1, wherein the first DC link circuit terminal and the second DC link circuit terminal are embodied as mutually compatible mating connectors in the form of a socket and a plug.

4. The converter module as claimed in claim 1, wherein the DC link circuit terminals are arranged on opposite sides of the housing of the converter module, in particular opposite one another in a mirror-inverted manner, wherein the mirror axis lies centrally between sides of the housing that are parallel to one another.

5. The converter module as claimed in claim 1, wherein the DC link circuit terminals are arranged along a horizontal or a vertical connecting line when the converter module is mounted in a permissible wall mounting position.

6. The converter module as claimed in claim 1, wherein the converter module comprises at least one power terminal for connection to a DC generator that generates the electrical power, to an electrical DC or AC load that consumes the electrical power, to a DC battery, or to an AC voltage grid.

7. An inverter for an energy generating system, wherein the inverter comprises at least two converter modules for converting electrical power, wherein the converter modules in each case comprise:
a housing,
at least one power terminal,
a first DC link circuit terminal comprising a first pair of connectors,
a capacitance connected to the first DC link circuit terminal and configured to stabilize a DC voltage present at the first DC link circuit terminal, wherein each connector of the first pair of connectors is coupled to a respective contact of a pair of contacts of the capacitance, and
a converter circuit comprising at least one power electronic semiconductor switch driven in a clocked manner,
wherein the converter circuit of one of the at least two converter modules is embodied as a DC-DC converter and the converter circuit of another of the at least two converter modules is embodied as an inverter bridge,
a second DC link circuit terminal comprising a second pair of connectors, which is connected to the capacitance and to the first DC link circuit terminal of the respective converter module, wherein each connector of the second pair of connectors is coupled to the respective contact of the pair of contacts of the capacitance, and the at least two converter modules are connected to one another via a respective one of their DC link circuit terminals, such that the capacitances connected via the DC link circuit terminals form a common DC link circuit, wherein the at least one power terminal is different from the first DC link circuit terminal and from the second DC link circuit terminal, and wherein the second DC link circuit terminal is different from the first DC link circuit terminal,
wherein the at least one power terminal of the converter module comprising the DC-DC converter is configured to connect a DC generator, a DC battery or a DC load, and wherein the at least one power terminal of the converter module comprising the inverter bridge is configured to connect an AC voltage grid or an AC load.

8. The inverter as claimed in claim 7, wherein the capacitances connected to the DC link circuit terminals of the at least two converter modules are configured such that the variation of the voltage present at the DC link circuit terminals in operation of the inverter with a maximum electrical power is limited to a predefined maximum variation with a minimum voltage necessary for feeding an AC current into an AC voltage grid as a lower limit by virtue of the capacitance of one of the at least two converter modules being connected to at least one capacitance of another of the at least two converter modules via at least one of the DC link circuit terminals, wherein the maximum electrical power flows from one or a plurality of the power terminals of the at least two converter modules via the DC link circuit terminals to one or a plurality of other power terminals.

9. The inverter as claimed in claim 7, wherein the first DC link circuit terminal of one of the at least two converter modules is connected to the second DC link circuit terminal of another of the at least two converter modules.

10. The inverter as claimed in claim 7, wherein the DC link circuit terminals of each of the at least two converter modules are arranged in each case oppositely on the housing of the respective one of the at least two converter modules.

11. The inverter as claimed in claim 7, wherein the at least two converter modules have an identical shaping and are mounted with direct connection of a respective one of the corresponding DC link circuit terminals, wherein the first and second DC link circuit terminals of each of the at least two converter modules are arranged with respect to one another in such a way that the at least two converter modules are oriented in alignment with one another with a housing side along a horizontal or vertical orientation line.

12. The inverter as claimed in claim 7, wherein the converter modules comprise control devices and communication means, wherein the control devices are configured to communicate via the communication means with the control devices of other converter modules.

13. The inverter as claimed in claim 7, wherein the communication means have communication terminals, wherein the communication terminals of the converter modules are connected to one another.

\* \* \* \* \*